(12) United States Patent
Ahn et al.

(10) Patent No.: US 7,674,661 B2
(45) Date of Patent: Mar. 9, 2010

(54) MEMORY DEVICE AND METHOD OF MANUFACTURING THE SAME

(75) Inventors: Young-Joon Ahn, Daejeon (KR); Suk-Pil Kim, Yongin-si (KR); Jong-Jin Lee, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 29 days.

(21) Appl. No.: 11/710,488

(22) Filed: Feb. 26, 2007

(65) Prior Publication Data
US 2008/0067580 A1   Mar. 20, 2008

(30) Foreign Application Priority Data
Sep. 19, 2006   (KR) ...................... 10-2006-0090585

(51) Int. Cl.
*H01L 21/00* (2006.01)
(52) U.S. Cl. ...................... 438/156; 438/173; 438/287; 257/E21.41
(58) Field of Classification Search ................ 438/156, 438/173, 192, 268; 257/E21.375, E21.383, 257/E21.41
See application file for complete search history.

(56) References Cited

U.S. PATENT DOCUMENTS

| | | | |
|---|---|---|---|
| 5,834,808 A | 11/1998 | Tsukiji | |
| 6,649,972 B2 | 11/2003 | Eitan | |
| 6,888,181 B1 | 5/2005 | Liao et al. | |
| 7,341,916 B2 * | 3/2008 | Lojek | 438/284 |
| 2005/0104096 A1 * | 5/2005 | Lee et al. | 257/288 |
| 2006/0141706 A1 * | 6/2006 | Hong | 438/257 |
| 2007/0082437 A1 * | 4/2007 | Cheng et al. | 438/197 |
| 2007/0210338 A1 * | 9/2007 | Orlowski | 257/213 |
| 2007/0284648 A1 * | 12/2007 | Park et al. | 257/316 |
| 2008/0087946 A1 * | 4/2008 | Hsu et al. | 257/328 |

FOREIGN PATENT DOCUMENTS

| | | |
|---|---|---|
| KR | 10-2006-0028575 | 3/2006 |
| KR | 0585111 | 5/2006 |

* cited by examiner

*Primary Examiner*—Chandra Chaudhari
*Assistant Examiner*—Julia Slutsker
(74) *Attorney, Agent, or Firm*—Harness, Dickey & Pierce, P.L.C.

(57) ABSTRACT

In a memory device and a method of manufacturing the memory device, a pair of channel layers included in the memory device may be formed on a sidewall of the sacrificial single crystalline layer pattern located on a protrusion of a semiconductor substrate. Accordingly, an etch damage may be reduced at the channel layer. The sacrificial single crystalline layer pattern may be removed to generate a void between the pair of the channel layers. As a result, a generation of a coupling effect may be reduced between the channel layers.

7 Claims, 9 Drawing Sheets

MEMORY DEVICE AND METHOD OF MANUFACTURING THE SAME

PRIORITY STATEMENT

This application claims benefit of priority under 35 U.S.C. §119 to Korean Patent Application No. 10-2006-0090585 filed on Sep. 19, 2006 in the Korean Intellectual Property Office, the entire contents of which is incorporated herein by reference in its entirety.

BACKGROUND

1. Field

Example embodiments relate to a memory device and/or a method of manufacturing the memory device. For example, example embodiments relate to a memory device retaining its data even when power is removed and/or a method of manufacturing the memory device.

2. Description of Related Art

In general, semiconductor memory devices may be classified as either volatile memory devices or non-volatile memory devices. Examples of volatile memory devices may include dynamic random access memory (DRAM) devices and static random access memory (SRAM) devices. The data input speed and/or data output speed of the volatile memory device may be relatively faster. However, data stored in the volatile memory device may not be retained when power is removed.

An example of a non-volatile memory device may be a read only memory (ROM) device such as an electrically erasable programmable read only memory (EEPROM) device. Flash memory devices, a type of EEPROM device, have enjoyed widespread use. Data input speed and/or data output speed of a flash memory device may be relatively slower. However, a flash memory device may retain its data even though power is removed.

In order to program and/or erase data, the flash memory device may employ Fowler-Nordheim tunneling or hot electron injection. Flash memory devices may generally be classified as either floating gate type flash memory devices or silicon-oxide-nitride-oxide-semiconductor (SONOS) type flash memory devices.

A method for improving integrity of a semiconductor device has been widely researched. As one example, a conventional non-volatile memory device may have one control gate and two floating gates. As another example, a conventional 2-bit non-volatile semiconductor memory cell may include two diffusion regions formed at a substrate, a channel region formed between the diffusion regions, and/or an oxide-nitride-oxide (ONO) layer.

In accordance with the latter example above, the ONO layer may include a first oxide layer, a nitride layer and/or a second oxide layer. The nitride layer may have a thickness of less than about 100 Å. The nitride layer may have two charge storing regions.

However, the integrity of the semiconductor device may still be required to be improved. Particularly, in the above examples, a storage density of data of the non-volatile memory device may be improved by varying a structure of the nitride or using the nitride layer as a data storing layer. However, the floating gate and the nitride layer may be horizontally formed. Accordingly, it may be difficult to reduce a size of the non-volatile memory device efficiently.

In order to overcome the above problems, a method of manufacturing a non-volatile memory device has been developed. In the method, a channel layer may be vertically formed and/or an ONO layer may be formed on a sidewall of the channel layer. However, an etching process employed to vertically form the channel layer may cause damage to the channel layer.

A space between the channel layers may be filled with a dielectric material having a relatively large dielectric constant. Accordingly, a coupling effect that degrades operating characteristics of the non-volatile memory device may be generated between the channel layers.

SUMMARY

Example embodiments may provide a memory device having a channel layer with reduced etch damage and/or capable of reducing a coupling effect generated between channel layers.

Example embodiments may provide a method of manufacturing the memory device.

According to an example embodiment, a memory device may include a semiconductor substrate, an isolation layer, a pair of channel layers, an ONO layer pattern and/or a conductive layer pattern. The semiconductor substrate may have a protrusion extending in a first direction. The isolation layer may be on both sides of the protrusion. The isolation layer may extend in the first direction. The pair of channel layers may be on the protrusion facing each other. The channel layers may extend in the first direction. The ONO layer pattern may be formed on the isolation layer and a sidewall of the channel layers. The ONO layer pattern may extend in a second direction substantially perpendicular to the first direction. The conductive layer pattern may be formed on the ONO layer pattern. The conductive layer pattern may extend in the second direction.

According to an example embodiment, the ONO layer pattern may be vertically spaced apart from the protrusion.

According to an example embodiment, the memory device may further include a spacer formed on a sidewall of the conductive layer pattern. The spacer may include an insulating layer formed on the protrusion, the isolation layer, the channel layer, the spacer, and/or the conductive layer pattern.

According to an example embodiment, the insulating layer may fill up a portion of a space between the channel layers. The portion of the space filled by the insulation layer may not be covered by the conductive layer pattern. The insulating layer may leave a void at a remaining portion of the space.

According to an example embodiment, a method of manufacturing a memory device may include forming a pair of channel layers on both sidewalls of a sacrificial single crystalline layer pattern on a semiconductor substrate, and/or removing the sacrificial single crystalline layer pattern.

According to an example embodiment, the sacrificial single crystalline layer pattern may extend in a first direction.

According to an example embodiment, forming the pair of channel layers may include forming a preliminary channel layer on both sidewalls of the sacrificial single crystalline layer pattern and/or an exposed portion of the semiconductor substrate, the sacrificial single crystalline layer pattern not being formed on the exposed portion of the semiconductor substrate, and/or removing a portion of the preliminary channel layer formed on the exposed portion of the semiconductor substrate.

According to an example embodiment, the preliminary channel layer may be formed by an epitaxial growth process performed on the sacrificial single crystalline layer pattern and/or the exposed portion of the semiconductor substrate.

According to an example embodiment, the method of manufacturing the memory device may include etching the exposed portion of the semiconductor substrate to a depth to form a recess at an upper portion of the semiconductor substrate, forming an isolation layer in the recess, forming an ONO layer and/or a conductive layer on the isolation layer, the channel layers, and/or the sacrificial single crystalline layer pattern, and/or patterning the ONO layer and/or the conductive layer to form an ONO layer pattern and/or a conductive layer pattern that may extend in a second direction substantially perpendicular to the first direction.

According to an example embodiment, there may be provided a method of manufacturing a memory device. In the method, a sacrificial single crystalline layer pattern may be formed on a semiconductor substrate. The sacrificial single crystalline layer pattern may extend in a first direction. A preliminary channel layer may be formed on both sidewalls of the sacrificial single crystalline layer pattern and/or an exposed portion of the semiconductor substrate. The sacrificial single crystalline layer pattern may not be formed on the exposed portion of the semiconductor substrate. A portion of the preliminary channel layer formed on the exposed portion of the preliminary channel layer may be removed to form a pair of channel layers on both sidewalls of the sacrificial single crystalline layer pattern.

According to an example embodiment, the exposed portion may be etched to a desired or predetermined depth to form a recess at an upper portion of the semiconductor substrate. An isolation layer may be formed in the recess. For example, an isolation layer filling up the recess may be formed. An ONO layer and/or a conductive layer may be formed on the isolation layer, the channel layer, and/or the sacrificial single crystalline layer pattern. For example the ONO layer and/or the conductive layer may be subsequently formed on the isolation layer, the channel layer, and/or the sacrificial single crystalline layer pattern. The ONO layer and/or the conductive layer may be patterned to form an ONO layer pattern and/or a conductive layer pattern that may extend in a second direction substantially perpendicular to the first direction. The sacrificial single crystalline layer pattern may be removed.

According to an example embodiment, in order to form the sacrificial single crystalline layer pattern, an epitaxial growth process may be performed on the semiconductor substrate to form a sacrificial single crystalline layer. The sacrificial single crystalline layer may be patterned to form a preliminary sacrificial single crystalline layer pattern extending in the first direction. An oxide layer having a substantially uniform thickness may be formed by performing a thermal oxidation process on the semiconductor substrate and/or both sidewalls of the preliminary sacrificial single crystalline layer, so that the sacrificial single crystalline layer pattern having a width smaller than that of the preliminary sacrificial single crystalline layer pattern may be formed. The oxide layer may be removed.

According to an example embodiment, in order to form the isolation layer, a preliminary isolation layer may be formed on the semiconductor substrate and/or the channel layer. A height of the preliminary isolation layer may be reduced to form the isolation layer.

According to an example embodiment, a spacer may be formed on sidewalls of the ONO layer pattern and/or the conductive layer pattern before the sacrificial single crystalline layer pattern is removed. An insulating layer may be formed on the semiconductor substrate, the isolation layer, the channel layer, the spacer, and/or the conductive layer pattern after the sacrificial single crystalline layer pattern is removed.

According to an example embodiment, the insulating layer may fill up a portion of a space between the channel layers. The portion of the space filled by the insulation layer may not be covered by the conductive layer pattern. The insulating layer may form a void at a remaining portion of the space.

According to an example embodiment, a channel layer may be formed on a sidewall of a sacrificial single crystalline layer pattern by performing an epitaxial growth process on the sidewall of the sacrificial single crystalline layer pattern. For example, the channel layer may be formed using the epitaxial growth process instead of an etch process. Accordingly, the channel layer may be formed with reduced etch damage that may be generated when the channel layer is formed using the etching process.

According to an example embodiment, the sacrificial single crystalline layer pattern may be removed to generate a void between the adjacent channel layers. The void may reduce a generation of a coupling effect between the channel layers. Accordingly, operation characteristics of a memory device may be improved.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
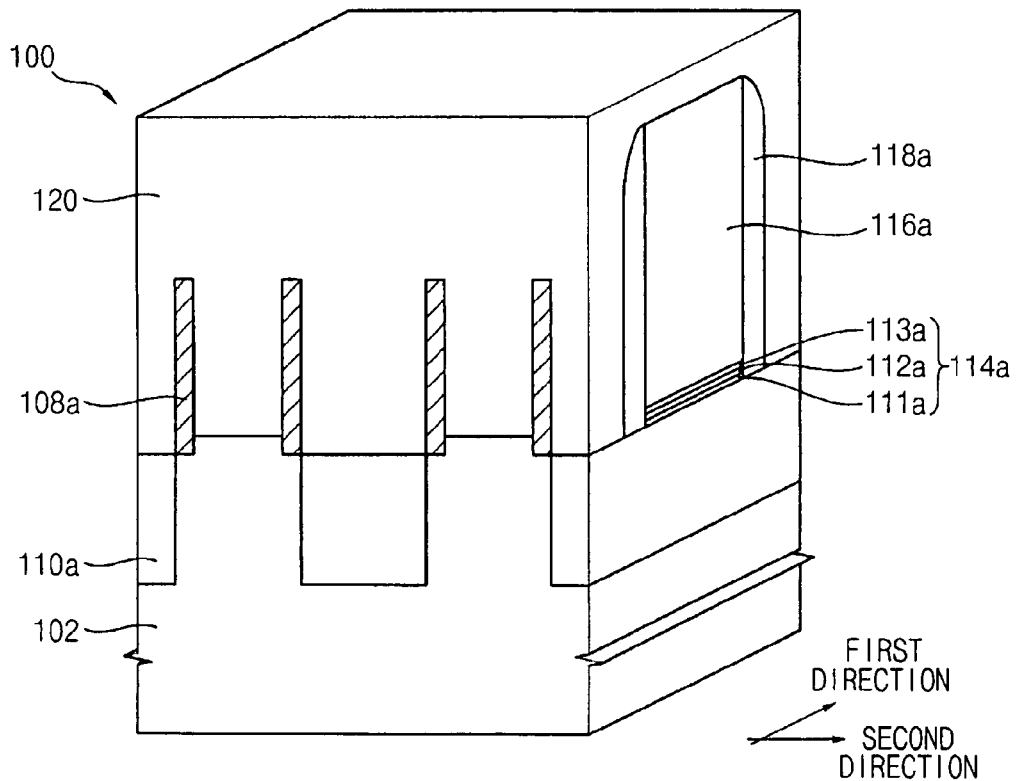
FIG. 1 is a perspective view illustrating a memory device in accordance with an example embodiment.

Example embodiments will now be described more fully hereinafter with reference to the accompanying drawings. Embodiments may, however, be in many different forms and should not be construed as limited to the example embodiments set forth herein. Rather, these example embodiments are provided so that disclosure will be thorough and complete, and will fully convey the scope to those skilled in the art. In the drawings, the size and relative sizes of layers and regions may be exaggerated for clarity. The drawings are not necessarily to scale. Like reference numerals designate like elements throughout the drawings.

It will also be understood that when an element or layer is referred to as being "on", "connected to" and/or "coupled to" another element or layer, the element or layer may be directly on, connected and/or coupled to the other element or layer or intervening elements or layers may be present. In contrast, when an element is referred to as being "directly on," "directly connected to" and/or "directly coupled to" another element or layer, no intervening elements or layers are present. As used herein, the term "and/or" may include any and all combinations of one or more of the associated listed items.

It will also be understood that, although the terms first, second, etc. may be used herein to describe various elements, components, regions, layers and/or sections. These elements, components, regions, layers and/or sections should not be limited by these terms. These terms may be used to distinguish one element, component, region, layer and/or section from another element, component, region, layer and/or section. For example, a first element, component, region, layer and/or section discussed below could be termed a second element, component, region, layer and/or section without departing from the teachings of example embodiments.

Spatially relative terms, such as "beneath," "below," "lower," "above," "upper" and the like may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as "below" and/or "beneath" other elements or features would then be oriented "above" the other elements or features. The device may be otherwise oriented (e.g., rotated 90 degrees or at other orientations) and the spatially relative descriptors used herein interpreted accordingly.

The terminology used herein is for the purpose of describing particular embodiments only and is not intended to be limiting. As used herein, the singular terms "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence and/or addition of one or more other features, integers, steps, operations, elements, components, and/or groups thereof.

Unless otherwise defined, all terms (including technical and scientific terms) used herein may have the same meaning as what is commonly understood by one of ordinary skill in the art. It will be further understood that terms, such as those defined in commonly used dictionaries, should be interpreted as having a meaning that is consistent with their meaning in the context of this specification and the relevant art and will not be interpreted in an idealized and/or overly formal sense unless expressly so defined herein.

Example embodiments are described with reference to cross-section illustrations that are schematic illustrations of example embodiments. Accordingly, variations from the shapes of the illustrations as a result, for example, of manufacturing techniques and/or tolerances, are to be expected. Accordingly, example embodiments should not be construed as limited to the particular shapes of regions illustrated herein but are to include deviations in shapes that result, for example, from manufacturing. For example, a region illustrated as a rectangle will, typically, have rounded or curved features. Accordingly, the regions illustrated in the figures are schematic in nature of a device and are not intended to limit the scope.

Hereinafter, a memory device and a method of manufacturing the memory device will be fully described.

Figure 2:
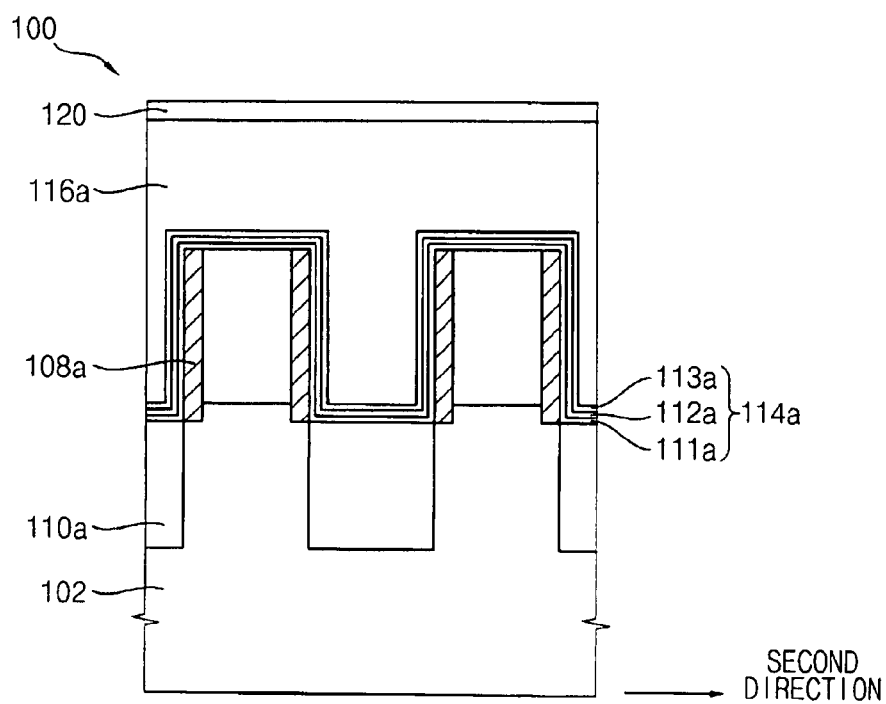
FIG. 2 is a cross-sectional view illustrating the memory device taken along a second direction in FIG. 1.

FIG. 1 is a perspective view illustrating a memory device in accordance with an example embodiment. Although FIG. 1 illustrates a non-volatile memory device, advantages of example embodiments may be employed in a volatile memory device such as a DRAM or an SRAM device. FIG. 2 is a cross-sectional view illustrating the memory device taken in a second direction in FIG. 1.

Referring to FIGS. 1 and 2, a memory device 100 may include a semiconductor substrate 102, an isolation layer 110a, a channel layer 108a, a spacer 118a, an ONO layer pattern 114a, a conductive layer pattern 116a and/or an insulating layer 120.

The semiconductor substrate 102 may include single crystalline silicon. Protrusions 2 (see FIG. 8) extending in a first direction may be formed at an upper portion of the semiconductor substrate 102. An isolation layer 110a including an insulating material such as silicon oxide may be formed at a space between the protrusions 2.

The isolation layer 110a may be formed by an isolation process such as a shallow trench isolation (STI) process. For example, a trench may be formed at the upper portion of the semiconductor substrate. The trench may be filled with the insulating material. Accordingly, the isolation layer 110a may be formed.

A pair of channel layers 108a may be formed on the protrusion 2 of the semiconductor substrate 102. The channel layers 108a may face each other on the protrusion 2. The channel layers may be extending in the first direction. The channel layer 108a may include single crystalline silicon.

The ONO layer pattern 114a may include a first oxide layer pattern 111a, a nitride layer pattern 112a, and/or a second oxide layer pattern 113a. The ONO layer pattern 114a may extend in a second direction substantially perpendicular to the first direction. The first oxide layer pattern 111a and/or the second oxide layer pattern 113a may be formed by a thermal oxidation process and/or a deposition process, respectively.

For example, the ONO layer pattern 114a may continuously enclose sidewalls of the isolation layer 110a and/or the channel layer 108a. The ONO layer pattern 114a may be vertically spaced apart from the protrusion 2 of the semiconductor substrate 102. For example, there may be a void between the ONO layer pattern 114a and the protrusion 2.

The conductive layer pattern 116a may include a conductive material such as metal or doped polysilicon. The conductive layer pattern 116a may be formed on the ONO layer pattern 114a. Accordingly, the conductive layer pattern 116a may extend in the second direction. The spacer 118a may be formed on a sidewall of the conductive layer pattern 116a. The spacer 118a may be formed using an insulating material such as silicon nitride.

An insulating layer 120 may be formed on the protrusion 2, the isolation layer 110a, the channel layer 108a, the spacer 118a, and/or the conductive layer pattern 116a. The insulating layer 120 may be formed using an insulating material such as silicon oxide.

For example, the insulating layer 120 may fill up a portion of a space between the channel layers 108a not covered by the conductive layer pattern 116a. The insulating layer 120 may leave a void at a remaining portion of the space.

Hereinafter, a method of manufacturing the memory device in FIGS. 1 and 2 is described.

FIGS. 3 to 15 are perspective views illustrating a method of manufacturing a memory device in FIGS. 1 and 2 according to an example embodiment. Although FIGS. 3 to 15 illustrate a method of manufacturing a non-volatile memory device, advantages of example embodiments may be employed in a method of manufacturing a volatile memory device such as a DRAM device or an SRAM device.

Figure 3:
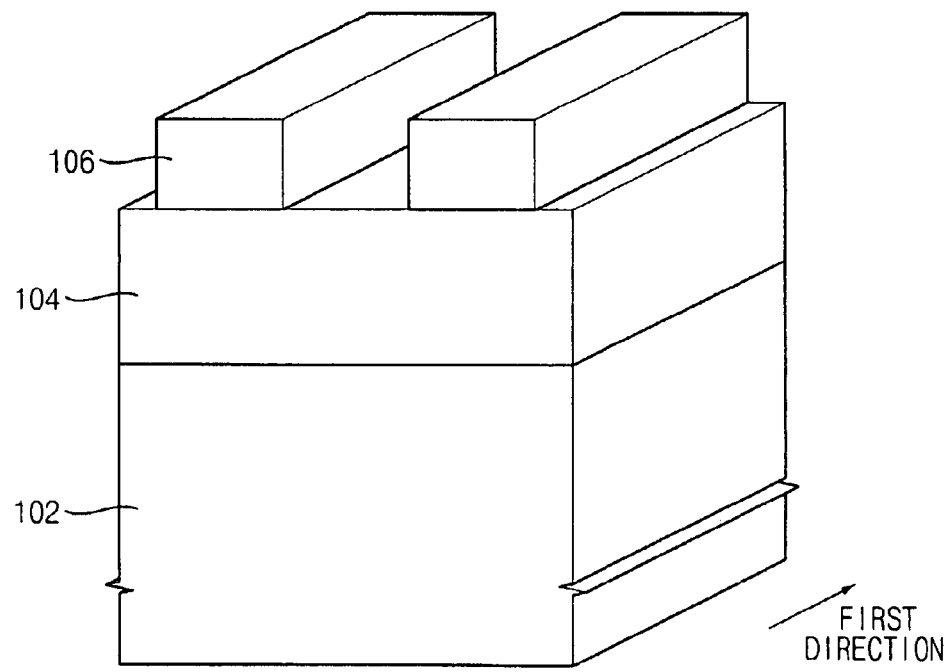
FIGS. 3 to 15 are perspective views illustrating a method of manufacturing the memory device in FIGS. 1 and 2 according to an example embodiment.

Referring to FIG. 3, a sacrificial single crystalline layer 104 may be formed on a semiconductor substrate 102 including silicon. The sacrificial single crystalline layer 104 may be formed by performing an epitaxial process on the semiconductor substrate 102.

The sacrificial single crystalline layer 104 may include a material allowing the sacrificial single crystalline layer 104 to epitaxially grow from the semiconductor substrate 102. However, the material included in the sacrificial single crystalline layer 104 may be different from that included in the semiconductor substrate 102. For example, the sacrificial single crystalline layer 104 may include silicon-germanium. However, another suitable material may be used instead of the silicon-germanium.

A mask layer pattern 106 may be formed on the sacrificial single crystalline layer 104. The mask layer pattern 106 may extend in a first direction. The mask layer pattern 106 may include a material such as silicon nitride. However, another suitable material may be used instead of silicon nitride.

Figure 4:
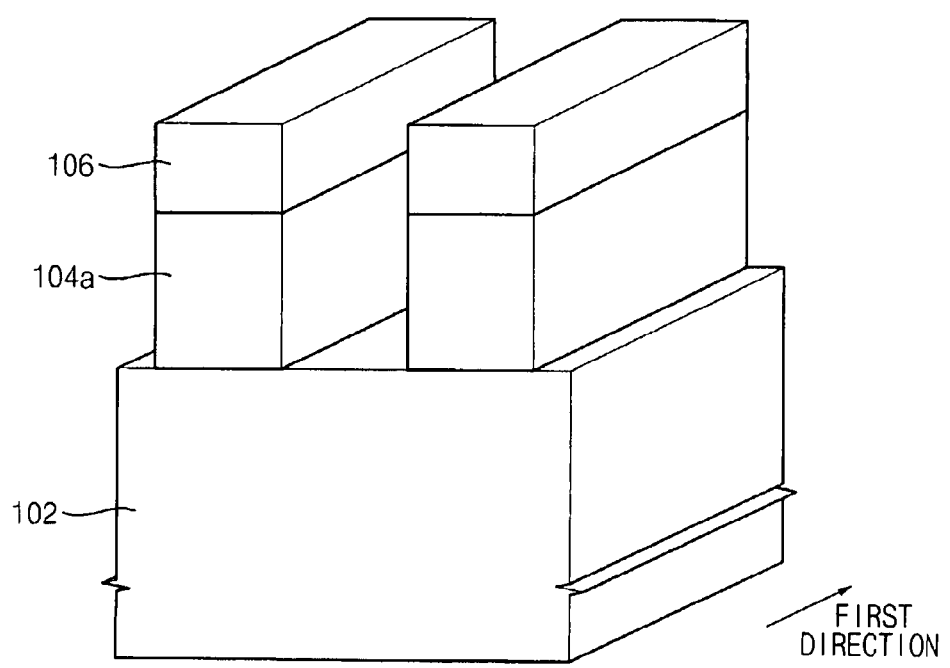

Referring to FIG. 4, the sacrificial single crystalline layer 104 may be etched using the mask layer pattern 106 as an etching mask until the semiconductor substrate 102 is exposed. Accordingly, the sacrificial single crystalline layer 104 may be transformed into a preliminary sacrificial single crystalline layer pattern 104a. The preliminary sacrificial single crystalline layer pattern 104a may extend in the first direction.

Figure 5:
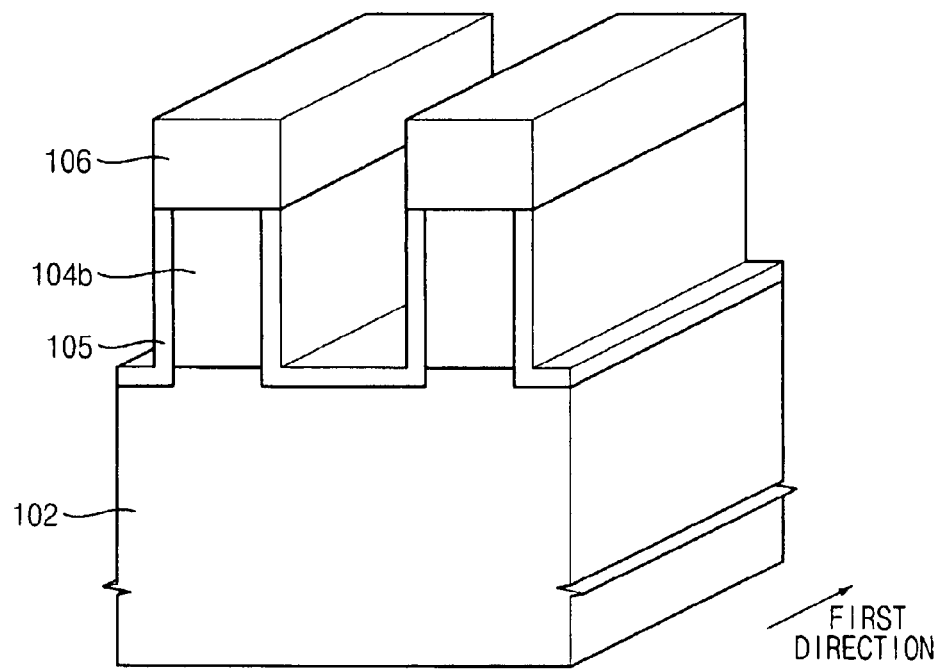

Referring to FIG. 5, a thermal oxidation process may be performed on the preliminary sacrificial single crystalline layer pattern 104a and/or the semiconductor substrate 102 so that a silicon oxide layer 105 having a substantially uniform thickness may be formed. Silicon in the preliminary sacrificial single crystalline layer pattern 104a may be reacted with oxygen when the silicon oxide layer 105 is formed. Accordingly, the preliminary sacrificial single crystalline layer pattern 104a may be transformed into a sacrificial single crystalline layer pattern 104b having a reduced width. For example, a width of the sacrificial single crystalline layer pattern 104b may be substantially smaller than that of the preliminary sacrificial single crystalline layer pattern 104a.

Figure 6:
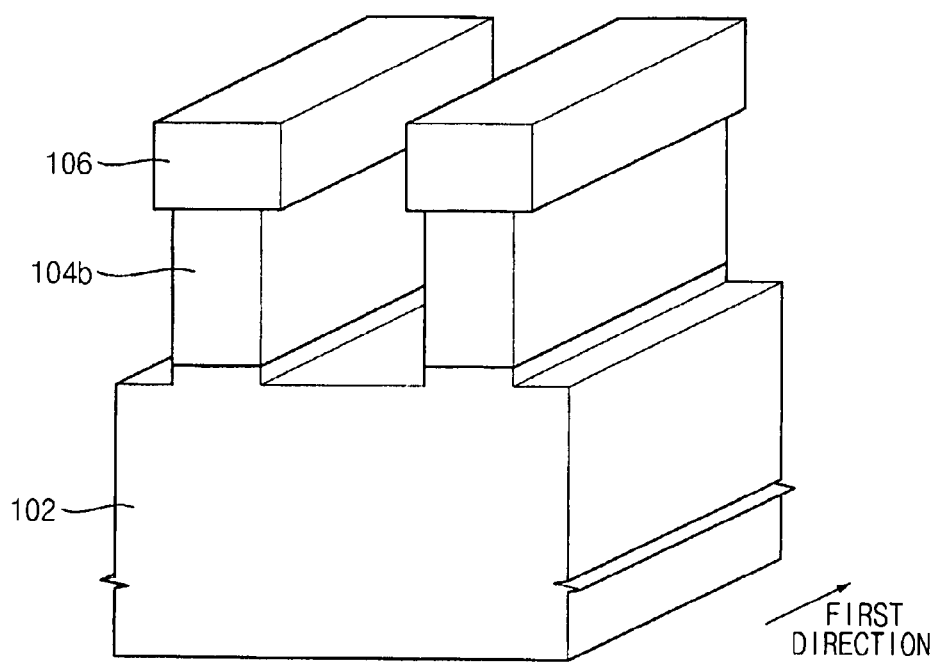

Referring to FIG. 6, a wet etching process may be performed on the silicon oxide layer 105 by using an etching solution including an etching material such as hydrogen fluoride (HF). The silicon oxide layer 105 may be selectively removed by the wet etching process.

Figure 7:
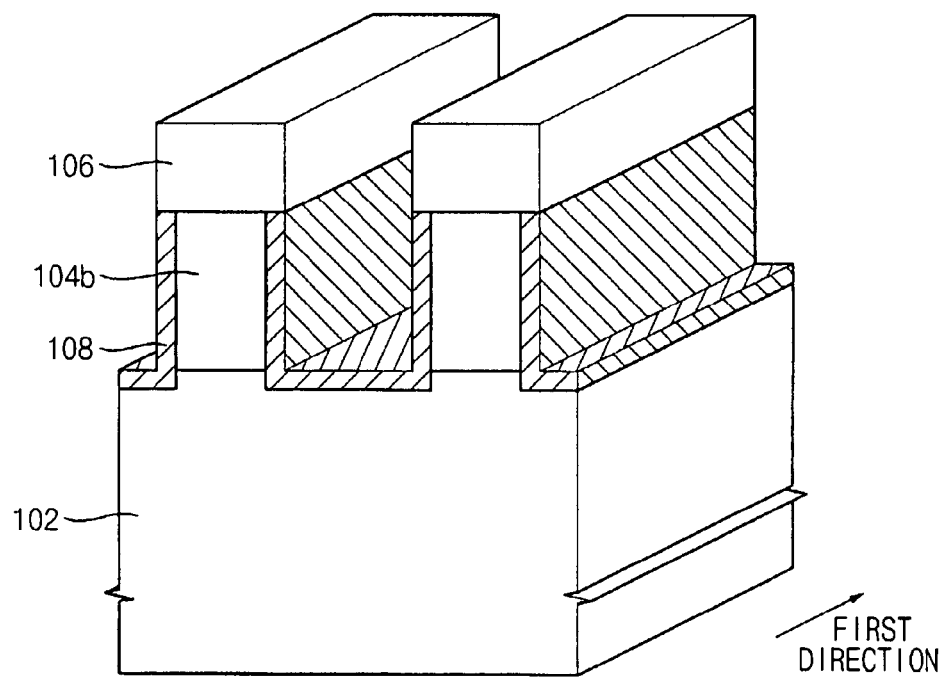

Referring to FIG. 7, an epitaxial growth process may be performed on the sacrificial single crystalline layer pattern 104b and/or the semiconductor substrate 102 so that a preliminary channel layer 108 having a substantially uniform thickness may be formed. The preliminary channel layer 108 may include single crystalline silicon. For example, the preliminary channel layer 108 may be formed at a space where the silicon oxide layer 105 may be removed by the wet etching process.

Figure 8:
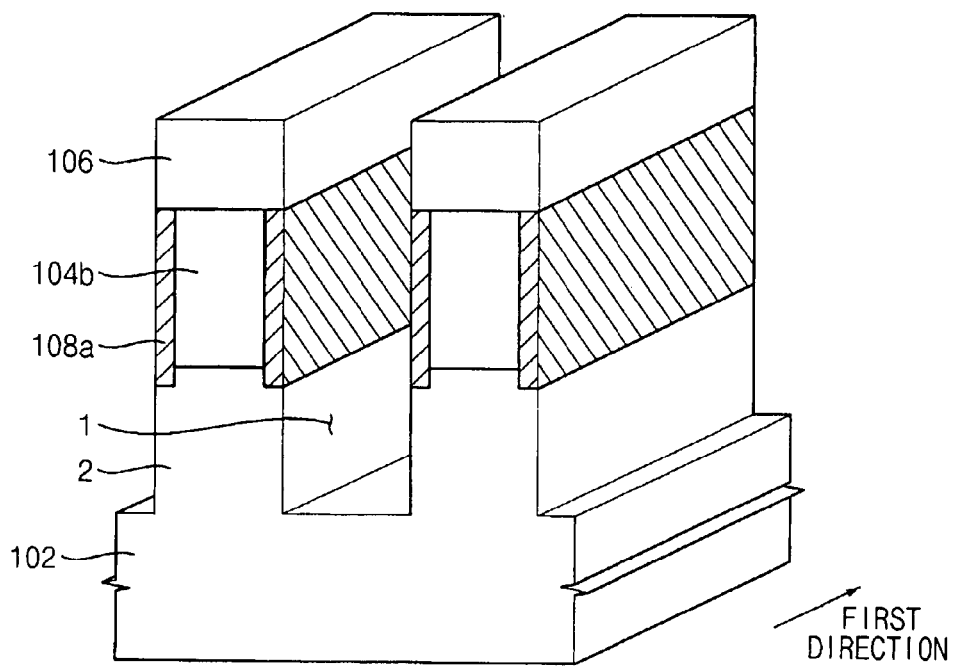

Referring to FIG. 8, the preliminary channel layer 108 and/or the semiconductor substrate 102 may be etched using the mask layer pattern 106 as an etching mask. For example, the preliminary channel layer 108 and/or the semiconductor substrate 102 may be subsequently etched using the mask layer pattern 106 as an etching mask. Accordingly, the preliminary channel layer 108 may be transformed into a channel layer 108a. A recess 1 extending in the first direction may be formed at the semiconductor substrate 102. A protrusion 2 may be formed at an upper portion of the semiconductor substrate 102 by forming the recess 1.

Figure 9:
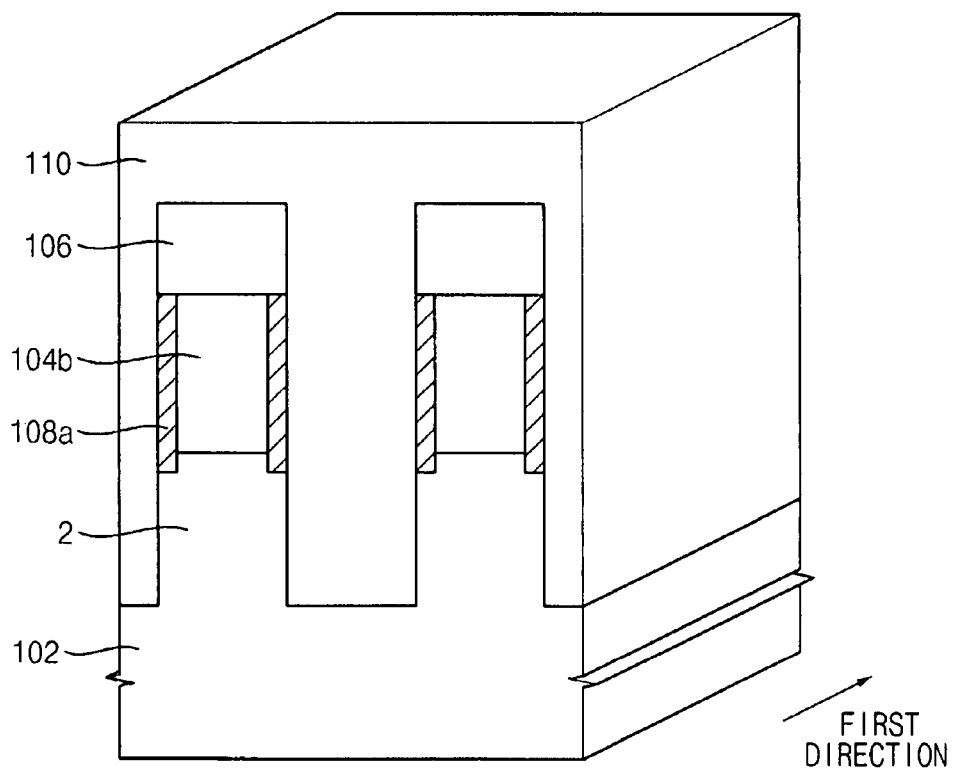

Referring to FIG. 9, a preliminary isolation layer 110 may be formed on the semiconductor substrate 102, the channel layer 108a and the mask layer pattern 106. The preliminary isolation layer 110 may be formed using an insulating material such as silicon oxide by a deposition process such as a chemical vapor deposition (CVD) process.

Figure 10:
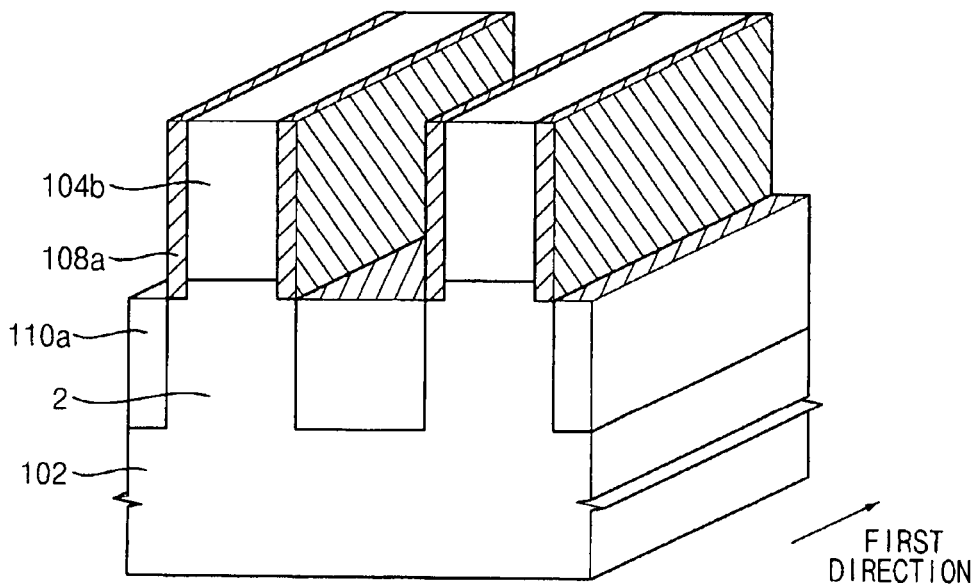

Referring to FIG. 10, an etch-back process may be performed on the preliminary isolation layer 110 to reduce a height of the preliminary isolation layer 110. Accordingly, the preliminary isolation layer 110 may be transformed into an isolation layer 110a filling up the recess 1. The mask layer pattern 106 may be removed.

Figure 11:
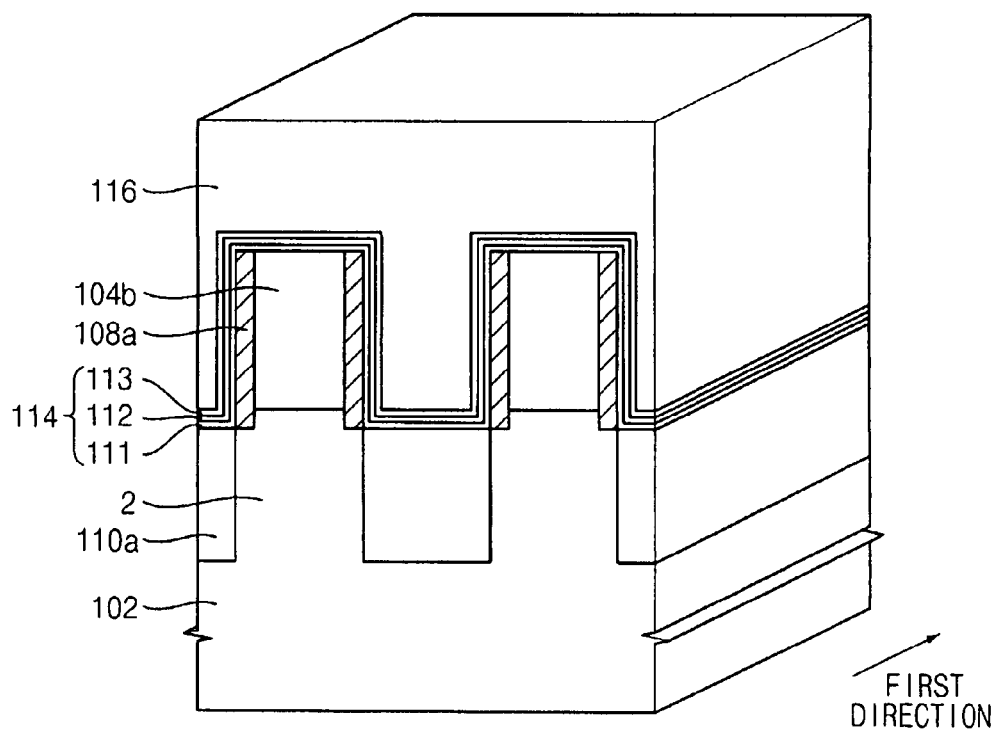

Referring to FIG. 11, an ONO layer 114 including a first oxide layer 111, a nitride layer 112, and/or a second oxide layer 113 may be formed on the isolation layer 110a, the channel layer 108a, and/or the sacrificial single crystalline layer pattern 104b. The ONO layer 114 may have a uniform thickness.

The first oxide layer 111 may be formed by a thermal oxidation process. The nitride layer 112 and/or the second oxide layer 113 may be formed by a deposition process such as a CVD process. In this case, it may be desirable that a thickness of the channel layer 108a is not excessively reduced when the first oxide layer 111 may be formed. A conductive layer 116 may be formed on the ONO layer 114. The conductive layer 116 may be formed using a conductive material such as metal or doped polysilicon.

Figure 12:
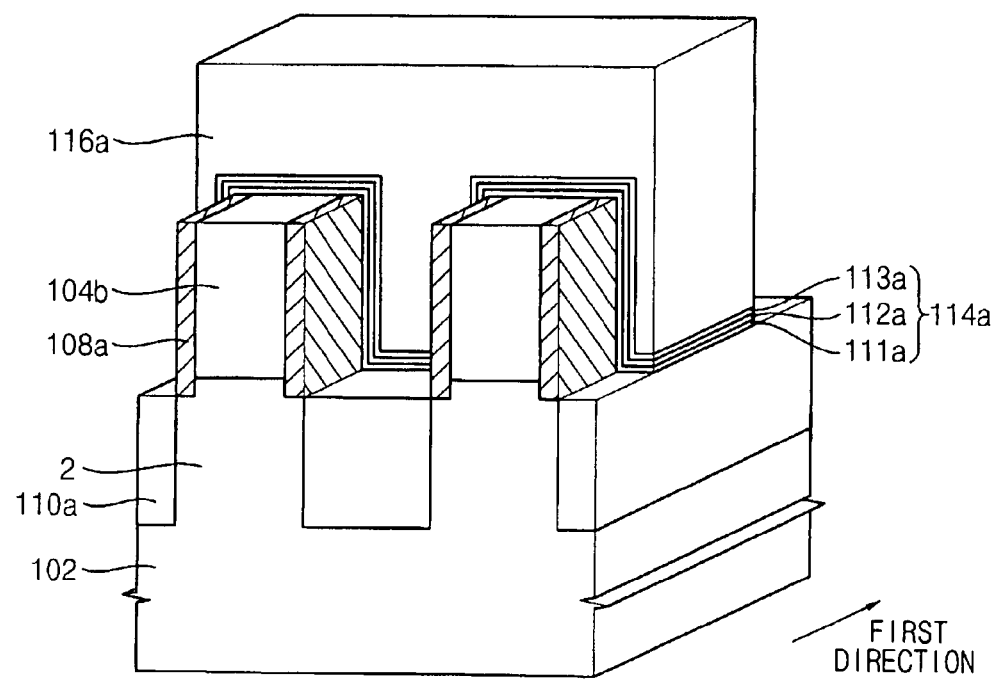

Referring to FIG. 12, an etching process may be performed on the conductive layer 116 and/or the ONO layer 114 until the isolation layer 110a may be exposed. Accordingly, the conductive layer 116 and/or the ONO layer 114 may be transformed into a conductive layer pattern 116a and/or an ONO layer pattern 114a, respectively. The conductive layer pattern 116a and/or the ONO layer pattern 114a may extend in a second direction substantially perpendicular to the first direction. The first oxide layer 111, the nitride layer 112, and/or the second oxide layer 113 included in the ONO layer 114 may be transformed into a first oxide layer pattern 111a, a nitride layer pattern 112a, and/or a second oxide layer pattern 113a, respectively.

Figure 13:
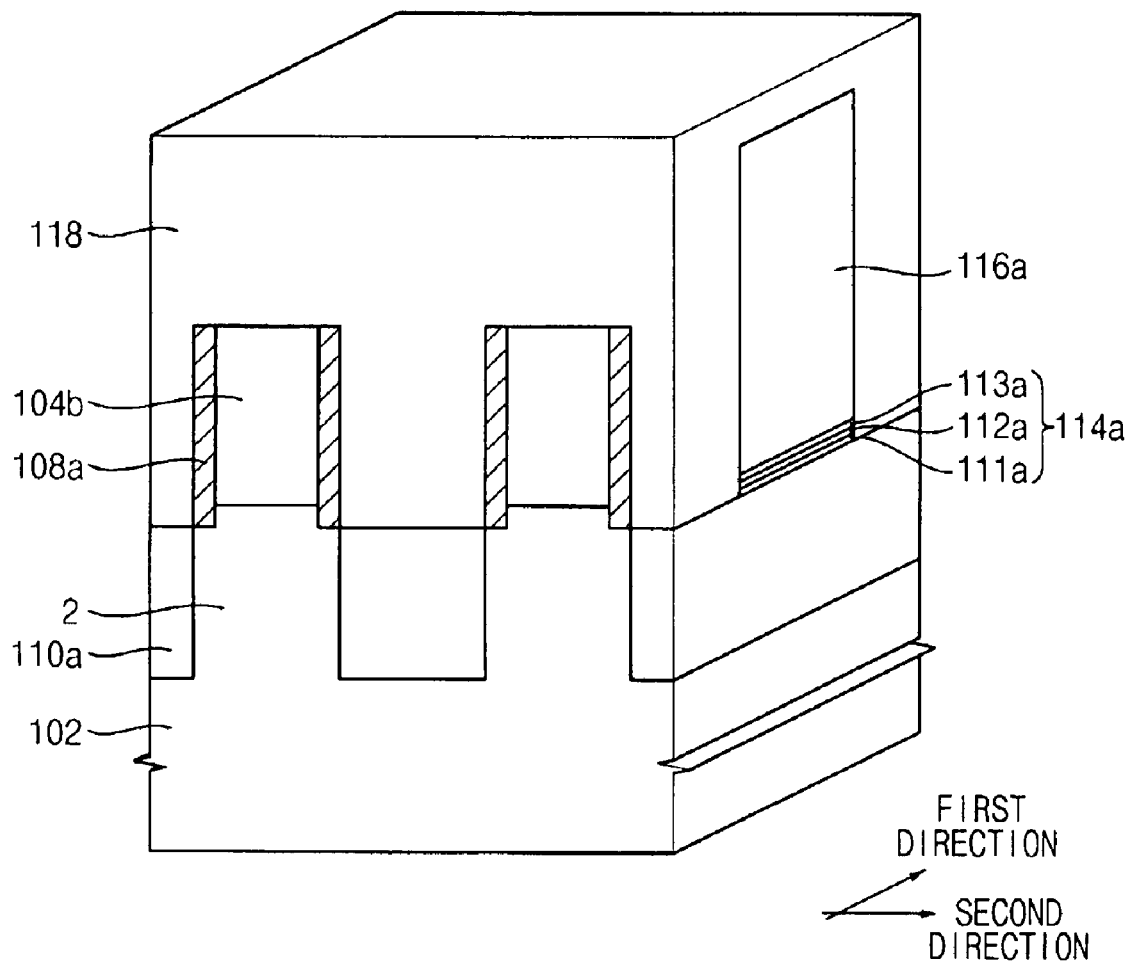

Referring to FIG. 13, a first insulating layer 118 may be formed on the conductive layer pattern 116a, the ONO layer pattern 114a, the sacrificial single crystalline layer pattern 104b, the channel layer 108a, and/or the isolation layer 110a. The first insulating layer 118 may be formed using an insulating material such as silicon nitride.

Figure 14:
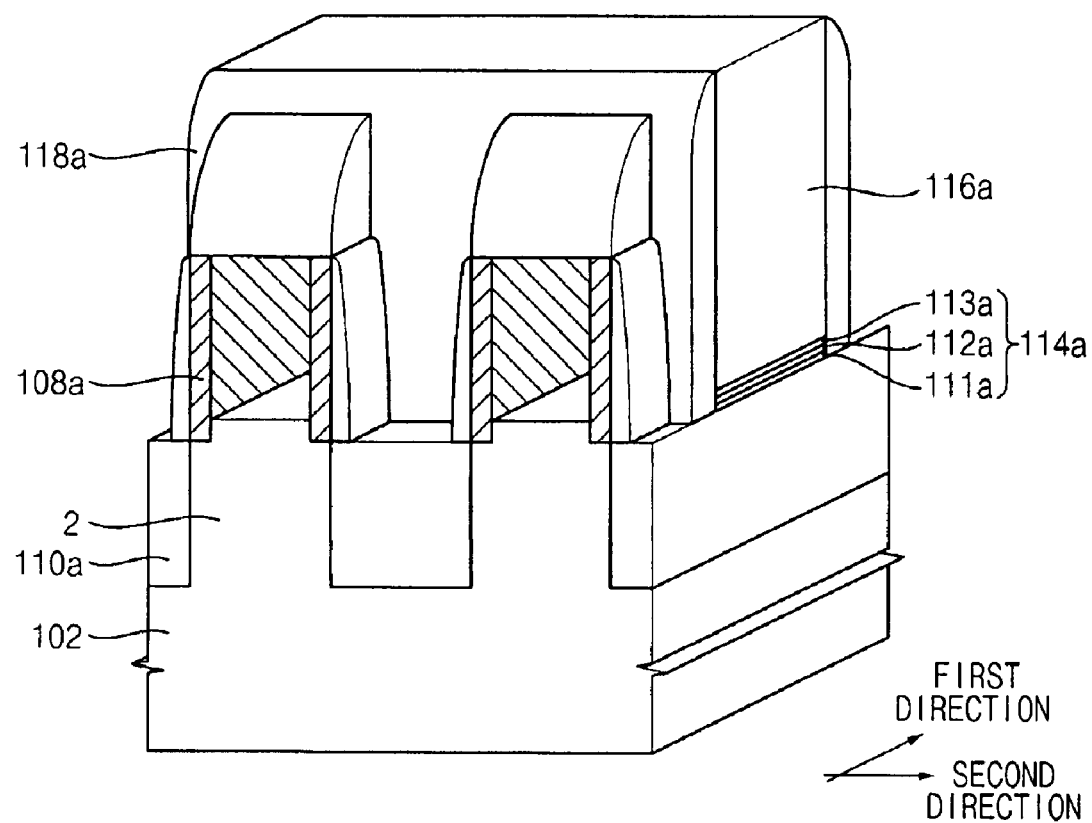

Referring to FIG. 14, an anisotropical etching process may be performed on the first insulating layer 118. Accordingly, the first insulating layer 118 may be transformed into a spacer 118a residing on a sidewall of the conductive layer pattern 116a. The sacrificial single crystalline layer pattern 104b may be removed. For example, the sacrificial single crystalline layer pattern 104b may be removed by a wet etching process.

As described above, the sacrificial single crystalline layer pattern 104b and/or the semiconductor substrate 102 may include silicon-germanium and silicon, respectively. Accordingly, the sacrificial single crystalline layer pattern 104b may be selectively etched by the wet etching process without etching the semiconductor substrate 102.

Figure 15:
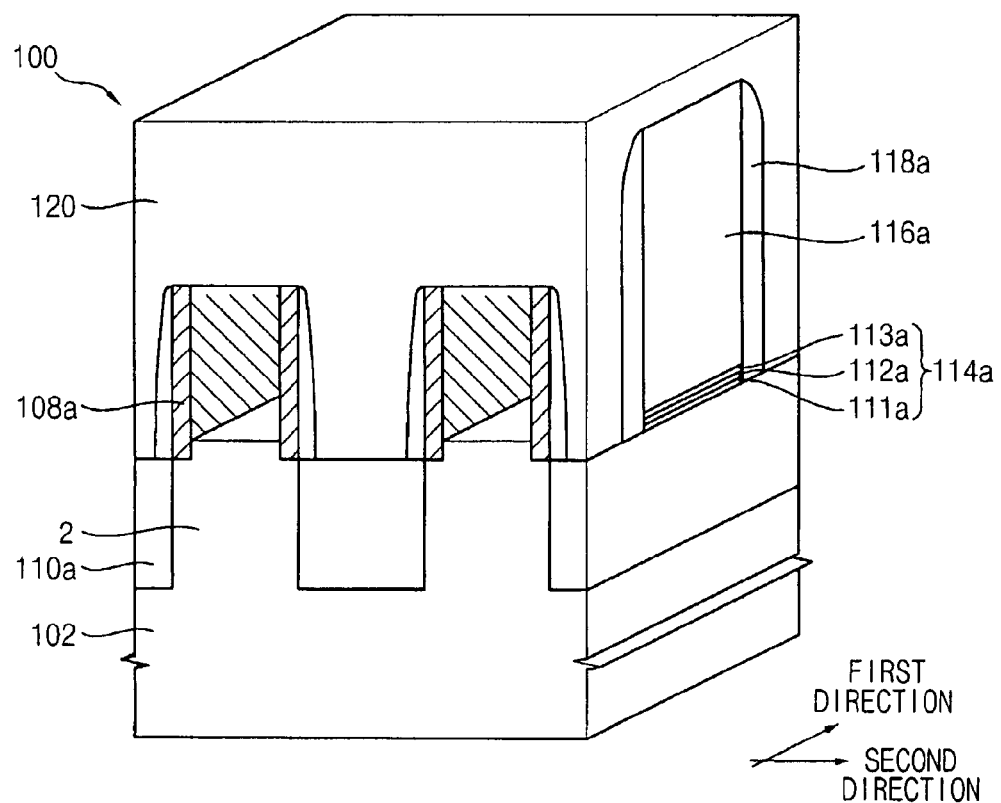

Referring to FIG. 15, a second insulating layer 120 may be formed on the semiconductor substrate 102, the channel layer 108a, the spacer 118a, and/or the conductive layer pattern 116a. The second insulating layer 120 may include an insulating layer such as silicon oxide. Accordingly, a memory device 100 may be completed.

Figure 16:
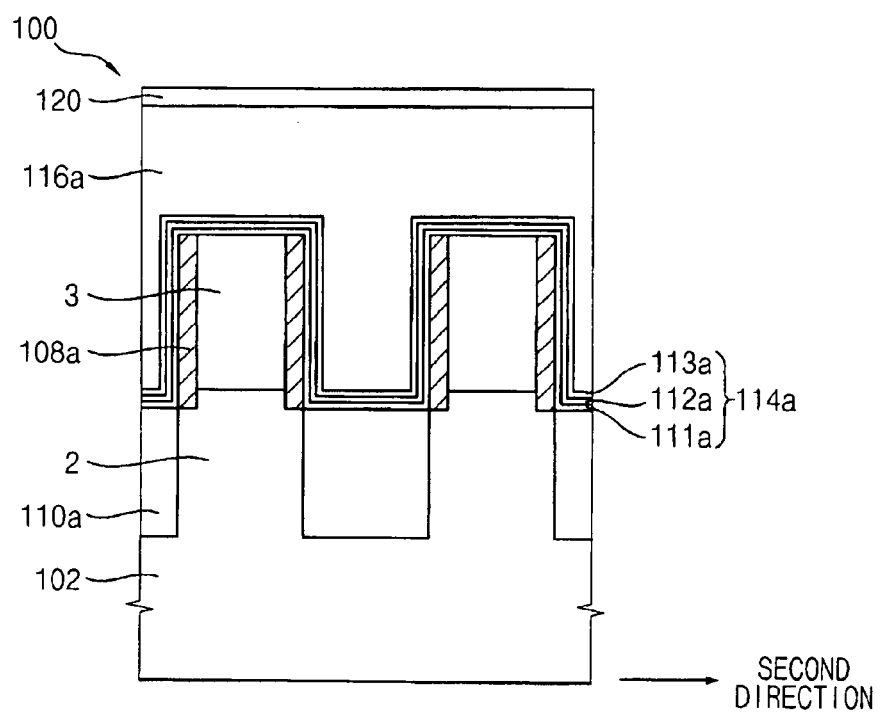
FIG. 16 is a cross-sectional view illustrating the memory device taken along the second direction in FIG. 15.

FIG. 16 is a cross-sectional view taken along the second direction in FIG. 15.

Referring to FIG. 16, a void 3 may be formed between the channel layers 108a that may be adjacent to each other. For example, the insulating layer 120 may not fully fill up a space where the sacrificial single crystalline layer pattern 104b may be removed when the insulating layer 120 is formed. Accordingly, the void 3 may be formed under the conductive layer pattern 116a. The void 3 may minimize a coupling effect generated between the channel layers 108a that may be adjacent to each other. As a result, operation characteristics of the memory device 100 may be improved.

According to an example embodiment, a channel layer may be formed on a sidewall of the sacrificial single crystalline layer pattern by performing an epitaxial growth process on the sacrificial single crystalline layer pattern. Accordingly, the channel layer may be formed without etching damage frequently generated in an etching process required for manufacturing a conventional channel layer.

A void may be formed between adjacent channel layers. The void may reduce a coupling effect generated between the adjacent channel layers so that operation characteristics of a memory device may be improved.

Although example embodiments have been shown and described in this specification and figures, it would be appreciated by those skilled in the art that changes may be made to the illustrated and/or described example embodiments without departing from their principles and spirit, the scope of which is defined by the claims and their equivalents. Accordingly, all such modifications are intended to be included within the scope. Therefore, it is to be understood that the foregoing is illustrative and is not to be construed as limited to the example embodiments disclosed, and that modifications to the disclosed example embodiments, as well as other embodiments, are intended to be included within the scope of the appended claims.

What is claimed is:

1. A method of manufacturing a memory device, the method comprising:
    forming a pair of channel layers on both sidewalls of a sacrificial single crystalline layer pattern on a semiconductor substrate, the forming the pair of channel layers including,
        forming a preliminary channel layer on both sidewalls of the sacrificial single crystalline layer pattern and an exposed portion of the semiconductor substrate, the sacrificial single crystalline layer pattern not being formed on the exposed portion of the semiconductor substrate, the sacrificial single crystalline layer pattern extending in a first direction, and
        removing a portion of the preliminary channel layer formed on the exposed portion of the semiconductor substrate;
    etching the exposed portion of the semiconductor substrate to a depth to form a recess at an upper portion of the semiconductor substrate;
    forming an isolation layer in the recess;
    forming an ONO layer and a conductive layer on the isolation layer, the channel layers, and the sacrificial single crystalline layer pattern;
    patterning the ONO layer and the conductive layer to form an ONO layer pattern and a conductive layer pattern that extends in a second direction substantially perpendicular to the first direction;
    forming a spacer on sidewalls of the ONO layer pattern and the conductive layer pattern before the sacrificial single crystalline layer pattern is removed; and
    removing the sacrificial single crystalline layer pattern, wherein
        the sacrificial single crystalline layer pattern has an etching selectivity with respect to an upper portion of the semiconductor substrate so that the upper portion of the semiconductor substrate is substantially not removed when the sacrificial single crystalline layer pattern is removed.

2. The method of claim 1, wherein the preliminary channel layer is formed by an epitaxial growth process performed on the sacrificial single crystalline layer pattern and the exposed portion of the semiconductor substrate.

3. The method of claim 1, wherein forming the sacrificial single crystalline layer pattern includes:
    performing an epitaxial growth process on the semiconductor substrate to form a sacrificial single crystalline layer;
    patterning the sacrificial single crystalline layer to form a preliminary sacrificial single crystalline layer pattern extending in the first direction;
    forming an oxide layer having a substantially uniform thickness on the semiconductor substrate and both sidewalls of the preliminary sacrificial single crystalline layer by using a thermal oxidation process to form the sacrificial single crystalline layer pattern having a width smaller than that of the preliminary sacrificial single crystalline layer pattern; and
    removing the oxide layer.

4. The method of claim 1, wherein forming the isolation layer includes:
    forming a preliminary isolation layer on the semiconductor substrate and the channel layer; and
    reducing a height of the preliminary isolation layer to form the isolation layer.

5. The method of claim 1, further comprising:
    forming an insulating layer on the semiconductor substrate, the isolation layer, the channel layers, the spacer and the conductive layer pattern after the sacrificial single crystalline layer pattern is removed.

6. The method of claim 5, wherein the insulating layer fills up a portion of a space between the channel layers not covered by the conductive layer pattern, the insulating layer leaving a void at a remaining portion of the space.

7. The method of claim 1, wherein the pair of channel layers are formed by performing an epitaxial growth process on both sidewalls of the sacrificial single crystalline layer pattern.

* * * * *